(12) United States Patent
Korambeth et al.

(10) Patent No.: US 10,297,289 B1
(45) Date of Patent: May 21, 2019

(54) SECURE SPEED LOADER FOR DRIVE CARRIERS

(71) Applicant: Seagate Technology LLC, Cupertino, CA (US)

(72) Inventors: Nived Chandroth Korambeth, Bengaluru (IN); Kiran Devapalan, Bangalore (IN); Shankar Gopalakrishna, Bangalore (IN); Yogeesha Bidare Manjunathaiah, Bangalore (IN)

(73) Assignee: Seagate Technology LLC, Cupertino, CA (US)

( * ) Notice: Subject to any disclaimer, the term of this patent is extended or adjusted under 35 U.S.C. 154(b) by 0 days.

(21) Appl. No.: 15/925,350

(22) Filed: Mar. 19, 2018

(51) Int. Cl.
*G06K 1/16* (2006.01)
*H05K 5/00* (2006.01)
*H05K 7/00* (2006.01)
*G11B 33/12* (2006.01)
*H05K 7/14* (2006.01)
*G06F 1/18* (2006.01)

(52) U.S. Cl.
CPC ............ *G11B 33/128* (2013.01); *G06F 1/187* (2013.01); *H05K 7/1409* (2013.01)

(58) Field of Classification Search
CPC ......... G06F 1/18–1/187; G11B 33/128; H05K 7/1409
USPC ...................... 361/724–727, 679.01, 679.02
See application file for complete search history.

(56) References Cited

U.S. PATENT DOCUMENTS

| 5,828,546 | A | * | 10/1998 | Tirrell | G11B 33/125 361/679.39 |
| 6,421,236 | B1 | | 7/2002 | Montoya et al. | |
| 6,538,972 | B1 | * | 3/2003 | Poulsen | G06F 1/1632 361/679.01 |
| 6,618,255 | B2 | | 9/2003 | Fairchild | |
| 8,041,449 | B2 | | 10/2011 | Noble et al. | |
| 8,967,689 | B2 | * | 3/2015 | Rees | G11B 17/04 294/103.1 |
| 2017/0322604 | A1 | | 11/2017 | Chen et al. | |

* cited by examiner

*Primary Examiner* — Anthony M Haughton
(74) *Attorney, Agent, or Firm* — Faegre Baker Daniels LLP

(57) ABSTRACT

A loader assembly includes a base, a moveable lock, a lower lock, and an upper lock. The base has a top side, a bottom side, a leading edge, and a trailing edge. The moveable lock is configured to move with respect to the base, and the moveable lock includes a tip portion configured to engage a storage media carrier. The lower lock extends from the top side of the base near the leading edge. And, the upper lock extends from the top side near the trailing edge.

20 Claims, 13 Drawing Sheets

SECURE SPEED LOADER FOR DRIVE CARRIERS

SUMMARY

In certain embodiments, a loader assembly includes a base, a moveable lock, a lower lock, and an upper lock. The base has a top side, a bottom side, a leading edge, and a trailing edge. The moveable lock is configured to move with respect to the base, and the moveable lock includes a tip portion configured to engage a storage media carrier. The lower lock extends from the top side of the base near the leading edge. And, the upper lock extends from the top side near the trailing edge.

In certain embodiments, a method is disclosed for using a storage media loader. The method includes engaging a storage media carrier with a storage media loader; moving a latch of the storage media carrier in a forward direction using the storage media loader to open a cover of the storage media loader; sliding the storage media loader in the forward direction until the storage media loader engages the storage media carrier at one or more engagements; and removing the storage media carrier from a storage media system or installing the storage media carrier in the storage media system.

In certain embodiments, a storage media loader includes a base, a moveable lock, at least one projection, and a stopper. The base has a top side, a bottom side, a leading edge, and a trailing edge. The moveable lock includes a tip portion configured to engage a portion of a storage media carrier. The at least one projection extends from the top side of the base near the leading edge, wherein each projection of the at least one projection is configured to engage a bottom side of a cover of the storage media carrier. The stopper is coupled to the top side near the trailing edge, the stopper configured to engage a top side of the cover of the storage media carrier.

While multiple embodiments are disclosed, still other embodiments of the present invention will become apparent to those skilled in the art from the following detailed description, which shows and describes illustrative embodiments of the invention. Accordingly, the drawings and detailed description are to be regarded as illustrative in nature and not restrictive.

Figure 1:
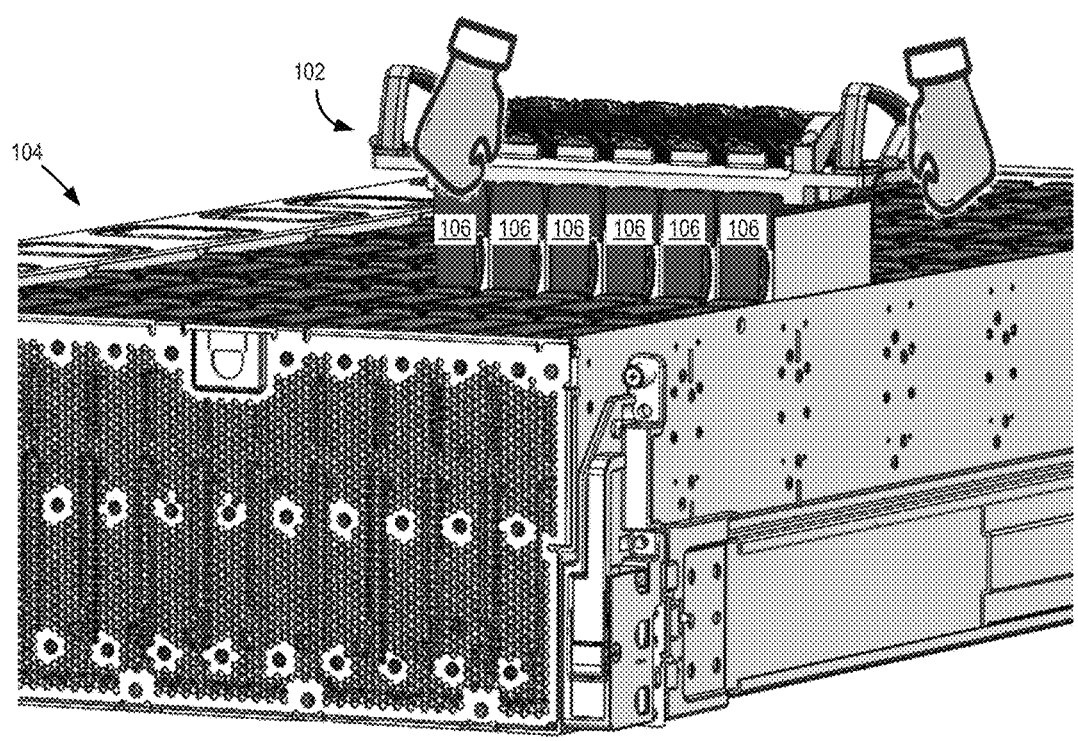
FIG. 1 is a perspective view of a storage media loader and storage media system, in accordance with certain embodiments of the present disclosure.

While the disclosure is amenable to various modifications and alternative forms, specific embodiments have been shown by way of example in the drawings and are described in detail below. The intention, however, is not to limit the disclosure to the particular embodiments described but instead is intended to cover all modifications, equivalents, and alternatives falling within the scope the appended claims.

DETAILED DESCRIPTION

High-density data storage systems include numerous storage media (e.g., hard disc drives, solid state drives) arranged within an enclosure. Loading the storage media into the enclosure and unloading the storage media from the enclosure is time consuming because, conventionally, this process is performed by a user that unloads and/or loads the storage media one at a time. During this process, the storage media may be damaged from being dropped and/or torqued in a manner that the storage media is not constructed to tolerate. In addition, the user performing this process is vulnerable to repetitive stress injuries.

Embodiments of the present disclosure feature a storage media loader that addresses these problems with conventional embodiments. In particular, the storage media loader facilitates faster unloading and loading of storage media into a storage media system by allowing a user to load multiple storage media into the system at the same time and unload multiple storage media from the system at the same time. Furthermore, the storage media loader decreases the likelihood storage media is damaged during the unloading and/or loading process because the storage media loader engages a storage media carrier housing the storage media at multiple points. As a result of these multiple engagements, the likelihood one or more storage media carriers are dropped during loading and/or unloading is reduced. In addition, the storage media loader reduces the likelihood a user loading and/or unloading the storage media suffers a repetitive stress injury because of the storage media loader's design.

FIG. 1 is a front perspective view of a storage media loader 102 and storage media system 104, in accordance with certain embodiments of the present disclosure. The storage media system 104 includes a plurality of storage media carriers 106. The storage media carriers 106 house and protect storage media 108 (see FIG. 2B). That is, the storage media carriers 106 may enable repeatable insertion and/or replacement of the storage media 108 into the storage media system 104. As illustrated, the storage media system 104 may include numerous storage media carriers 106 housing storage media 108. For example, a storage media system 104 may house more than 50 storage media carriers 106.

Figure 2:
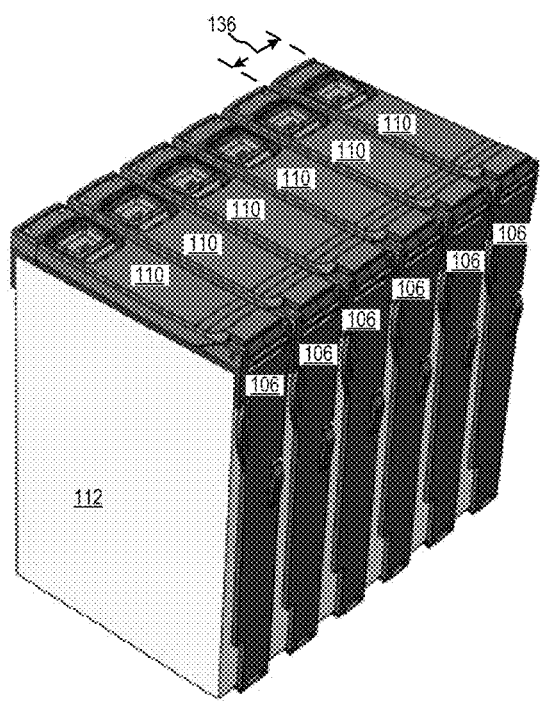
FIGS. 2-3 are perspective views of a plurality of storage media carriers for use with the storage media system and storage media loader of FIG. 1, in accordance with certain embodiments of the present disclosure.
Figure 3:
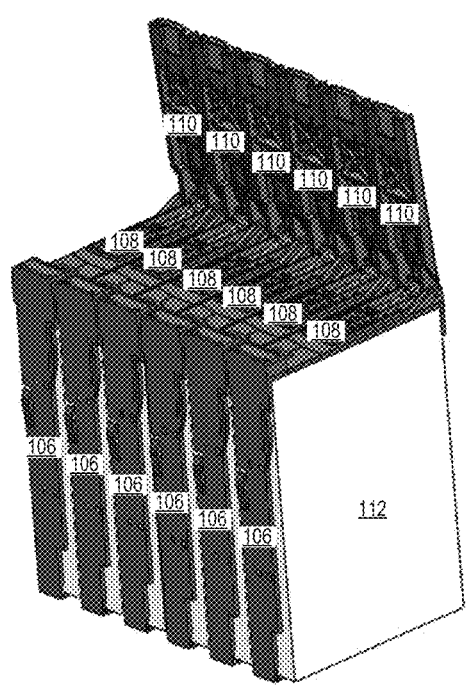
Figure 4:
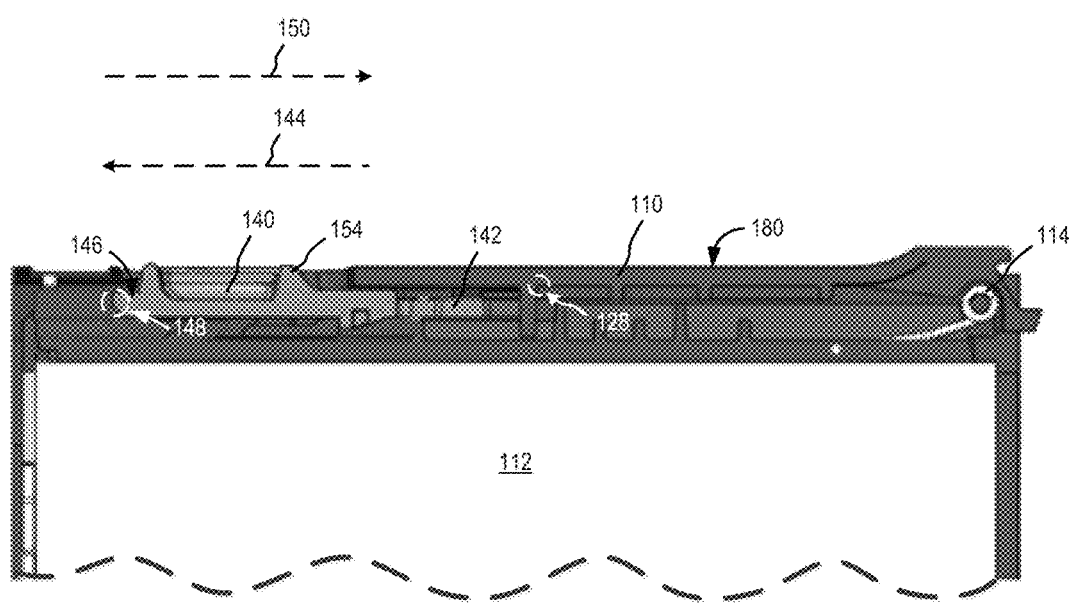
FIG. 4 is a side view of a portion of a storage media carrier depicted in FIGS. 2-3.
Figure 5:
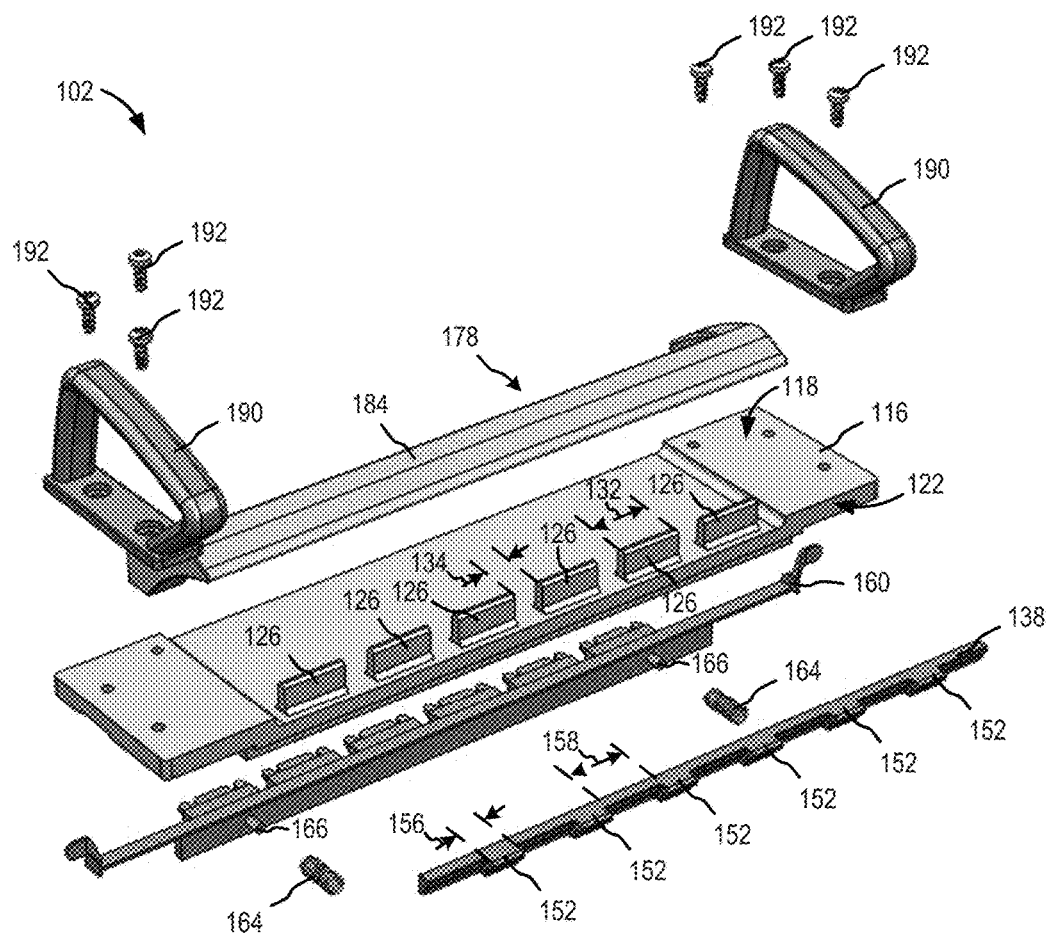
FIG. 5 is an exploded, perspective view of the storage media loader of FIG. 1.

Exemplary storage media carriers 106 are depicted in FIGS. 2-4. The storage media carriers 106 house storage media 108 as stated above. Referring to FIG. 4, each storage media carrier 106 includes a cover 110 secured to a housing 112 via a pin 114. Each cover 110 is configured to open and close for insertion of storage media 108 into the housing 112 and removal of storage media 108 from the housing 112. Conventionally, a user will remove a storage media carrier 106 from a storage media system 104 by opening the cover 110 and pulling on the cover 110. A user may also use the cover 110 to carry the storage media carrier 106 from a first location to a second location once the storage media carrier 106 is removed from the storage media system 104. Removing and carrying the storage media carrier 106 in this manner puts a lot of stress on the pins 114. The pins 114 are generally not constructed to withstand these forces and/or torques. As such, pins 114 may break during this process, which results in damage to the storage media 108.

The storage media loader 102 described herein may reduce the force and/or torque on the pins 114 by including multiple points of contact with the storage media carrier 106. The multiple points of contact may be referred to herein as first, second, and third engagements. As a result of the first, second, and third engagements, the storage media loader 102 has the potential to reduce the likelihood the pins 114 are broken and a storage media carrier 106 and/or storage media 108 is damaged.

Referring to FIGS. 5-10, an exemplary embodiment of a storage media loader 102 is depicted. In the exemplary embodiment, the storage media loader 102 includes a base 116. The base 116 includes a top side 118, a bottom side 120 (see FIG. 8), a leading edge 122, and a trailing edge 124 (see FIG. 8).

Extending from the top side 118 are one or more spaced-apart engagement projections 126. The engagement projections 126 may be configured to engage an indentation 128 (see FIGS. 4 and 13) on the lower side of the cover 110. The indentation 128 may form substantially a 90 degree angle. The engagement between the indentation 128 and the projection 126 may be referred to herein as a first engagement between the storage media loader 102 and the storage media carrier 106.

Due to the first engagement, the likelihood the storage media carrier 106 is dropped while carrying the storage media carrier 106 with the storage media loader 102 may be reduced because the first engagement restricts movement between the storage media loader 102 and the storage media carrier 106. That is, the first engagement prevents the cover 110 from moving in a downward direction 130 (see FIGS. 9, 10, 13, and 16). As such, the engagement projections 126 may function as a lock, and more specifically a lower lock on the covers 110. In embodiments, the downward direction 130 may be substantially from the top side 118 to the bottom side 120.

The number of engagement projections 126 may vary depending on how many storage media carriers 106 the storage media loader 102 is configured to carry. For example, a storage media loader 102 having six engagement projections 126 may be configured to carry six storage media carriers 106. Additionally or alternatively, the engagement projections 126 may extend substantially perpendicular from a surface on the top side 118. Alternatively, the engagement projections 126 may be angled toward the trailing edge 124.

The engagement projection width 132 and/or the separation 134 between the engagement projections 126 may depend on the storage media carrier width 136 (see FIG. 2). For example, if the storage media carrier width 136 is X, then the engagement projection width 132 may be n*X and the separation 134 between each of the engagement projections 126 may be (1-n)*X, where n is a number greater than 0 and less than 1.

In at least one embodiment, the engagement projections 126 and the base 116 are a unitary structure. In another embodiment, the engagement projections 126 and the base 116 are coupled and/or fused together. In these embodiments, the engagement projections 126 and the base 116 may be coupled together using one or more fasteners (e.g., screws) and/or adhered to one another (e.g., using glue, epoxy).

In the illustrated embodiment, the storage media loader 102 includes a drive ejector 138. The drive ejector 138 may be arranged near the bottom side 120 of the base 116 near the leading edge 122. The drive ejector 138 is configured to engage a latch 140 (see FIG. 4) on the cover 110 to facilitate opening of the cover 110. Referring to FIG. 4, the cover 110 may include a biasing mechanism 142 (e.g., a spring) that biases the latch 140 in a first direction 144. The first direction 144 may also be referred to herein as a rearward direction 144. In embodiments, the first direction 144 may be substantially from the leading edge 122 towards the trailing edge 124.

When the latch 140 is in a first position (illustrated in FIG. 4), the latch 140 prevents the cover 110 from being opened. That is, when the latch 140 is in the first position, an engagement portion 146 of the latch 140 is received by a recess 148 of the housing 112, which prevents the cover 110 from being opened. When the latch 140 is moved in a second direction 150 to a second position (not shown), the engagement portion 146 is no longer in the recess 148 and the cover 110 is capable of being opened. The second direction 150 may also be referred to herein as a forward direction 150. In embodiments, the second direction 150 may be substantially from the trailing edge 124 towards the leading edge 122.

Referring back to FIGS. 5-10, to facilitate engagement between the drive ejector 138 and the latch 140, the drive ejector 138 may include one or more engagement ledges 152. Each of the engagement ledges 152 are of a shape and/or size to be received by a respective tab 154 of the latch 140. For example, each of the engagement ledges 152 forms approximately a 90 degree angle to prevent the tab 154 from slipping while the driver ejector 138 engages the latches 140.

Figure 11:
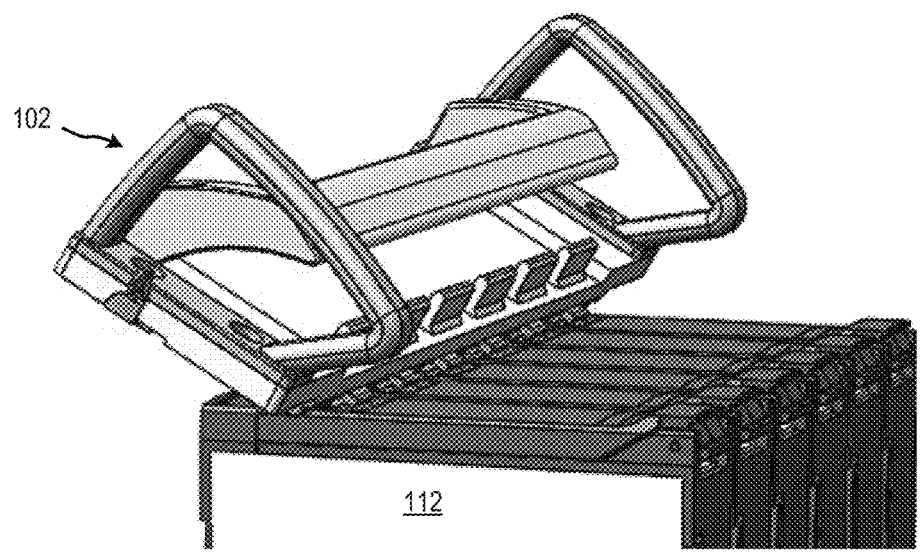
FIGS. 11-16 are schematic representations of removing a storage media carrier using the storage media loader of FIG. 1, in according with certain embodiments of the present disclosure.
Figure 12:
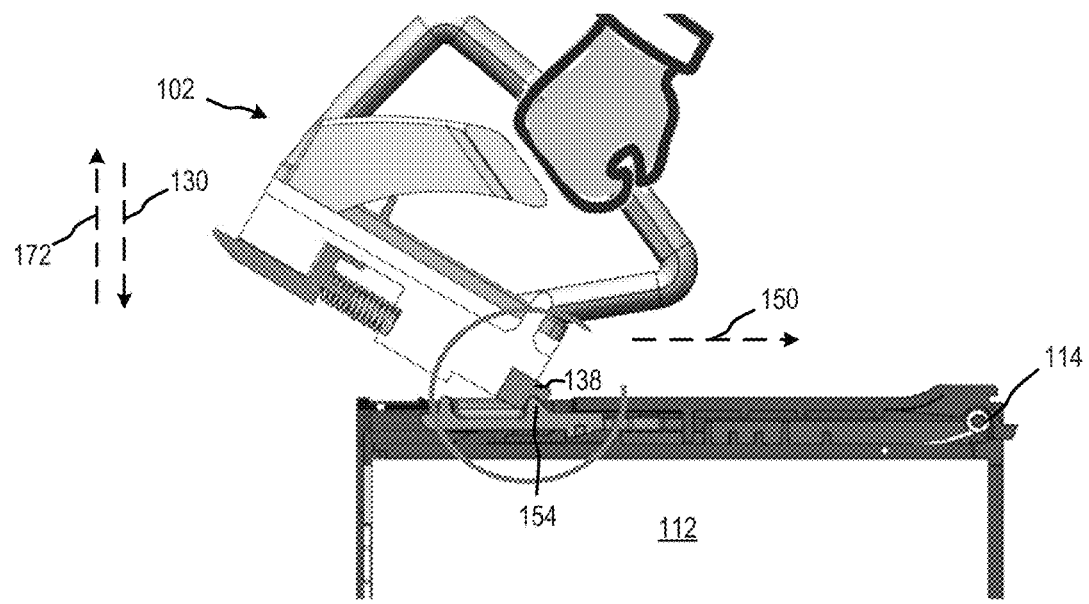
Figure 13:
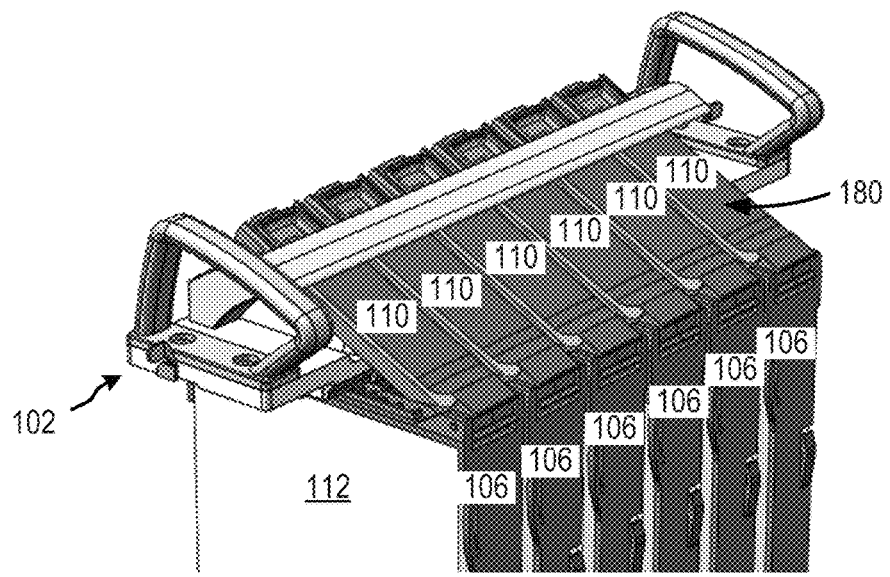

Referring to FIGS. 11-13, a user grasps the storage media loader 102 and directs the drive ejector 138 to contact the tabs 154 of the latches 140 (depicted in FIGS. 11 and 12). The user then moves the drive ejector 138 in the second direction 150 in order to move the latch 140 from a first position (depicted in FIG. 12) to a second position (not shown). When in the second position, the engagement portion 146 no longer is in the recess 148 of the housing 112. The cover 110 may then be opened and a portion of the storage media loader 102 is capable of being slid under the covers 110, as depicted in FIG. 13.

Referring back to FIGS. 5-10, the drive ejector 138 and the base 116 may be a unitary structure. In another embodiment, the drive ejector 138 and the base 116 are coupled and/or fused together. In these embodiments, the base 116 may include a cavity (not shown) that receives a portion of the drive ejector 138. The cavity of the base 116 and the portion of the drive ejector 138 inserted into the cavity may form an interference fit in order to secure the drive ejector 138 to the base 116. Additionally or alternatively, the drive ejector 138 and the base 116 may be coupled together using one or more fasteners (e.g., screws) and/or adhered to one another (e.g., using glue, epoxy).

In embodiments, the drive ejector 138 may be formed of an elastomer material to facilitate engagement between the engagement ledges 152 and the tabs 154. The number of engagement ledges 152 may vary depending on how many storage media carriers 106 the storage media loader 102 is configured to carry. For example, a drive ejector 138 having six engagement ledges 152 may be configured to engage six storage media carriers 106. The engagement ledge width 156 and/or the separation 158 between the engagement ledges 152 may depend on the width of the latch 140. For example, if the width of the latch 140 is X, then the engagement ledge width 156 may be n*X and the separation 158 between each of the engagement ledges 152 may be (1-n)*X, where n is a number greater than 0 and less than 1.

The storage media loader 102 may also include a moveable lock 160. The moveable lock 160 may be arranged on the bottom side 120 of the base 116 near the trailing edge 124. The moveable lock 160 may be moveable with respect to the base 116. For example, the moveable lock 160 may be moveable along a plane 162 (see FIGS. 9 and 10) extending between the leading edge 122 to the trailing edge 124. To be moveable with respect to the base 116, the moveable lock 160 may be coupled to the base 116 via one or more springs 164. For example, the base 116 may include a hole (not shown) that receives the spring 164 (see FIG. 5) and the moveable lock 160 may include one or more projections 166 (see FIG. 5) insertable into the springs 164. In addition, the base may include a channel 168 (see FIG. 8) that receives a portion of the moveable lock 160. The moveable lock 160 may be slidable along the plane 162 in the channel 168.

Figure 6:
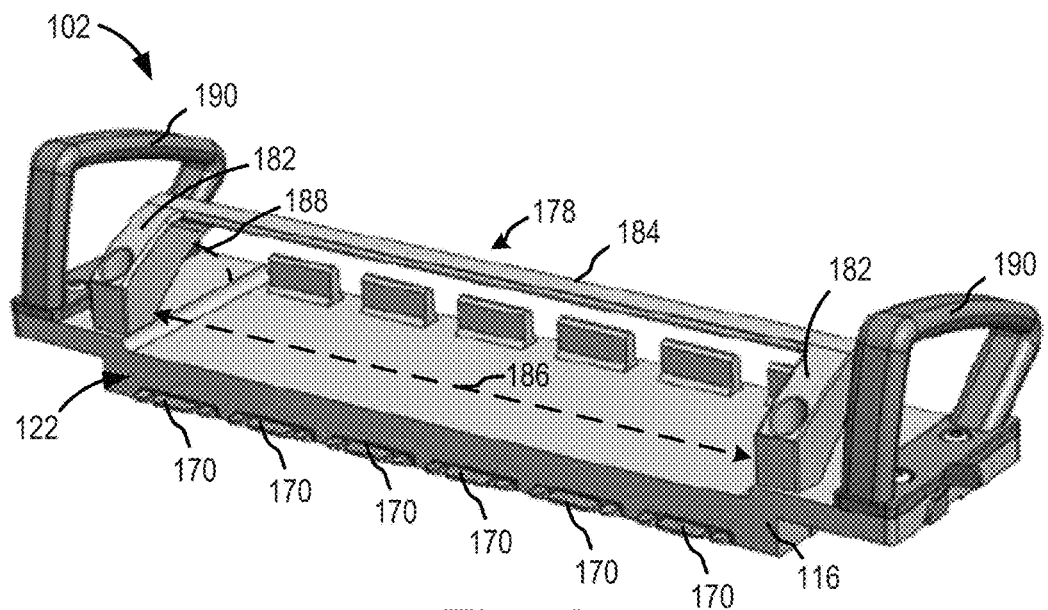
FIG. 6 is a perspective view of the storage media loader of FIG. 1.
Figure 7:
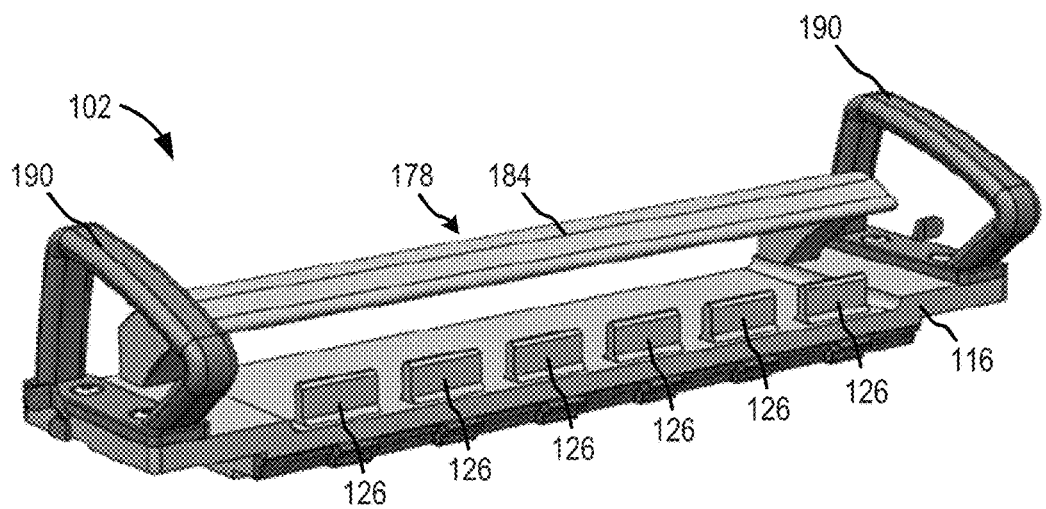
FIG. 7 is another perspective view of the storage media loader of FIG. 1.
Figure 8:
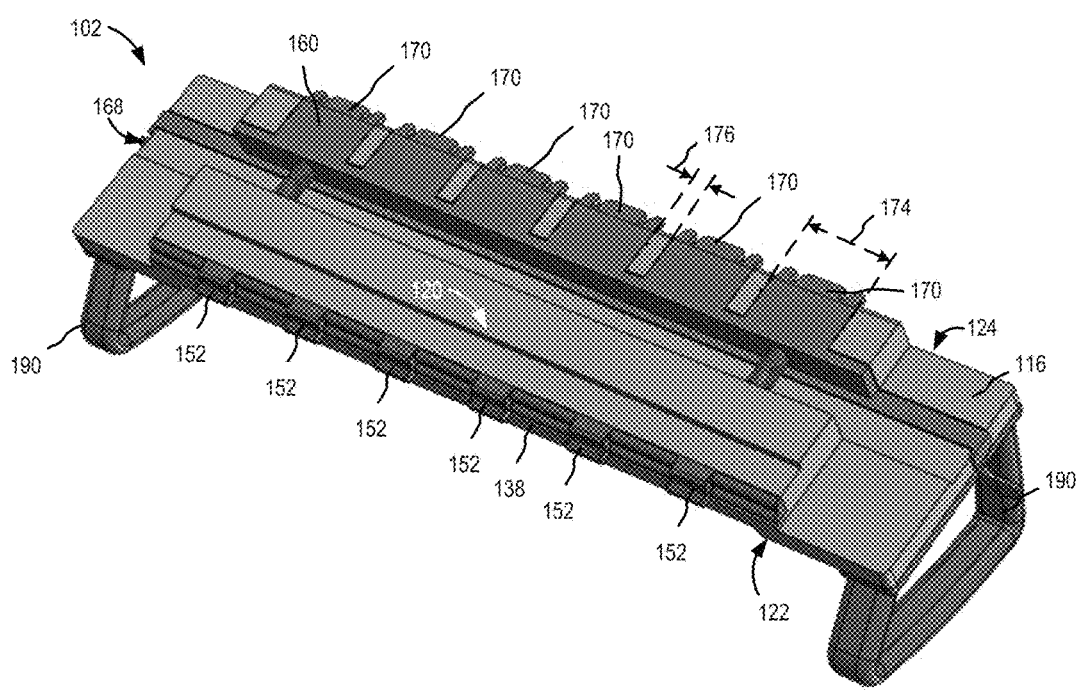
FIG. 8 is a bottom perspective view of the storage media loader of FIG. 1.

The moveable lock 160 may include one or more one or more tip portions 170 (see FIGS. 6 and 8). The tip portions 170 may project towards the first direction 144 and may be of a shape and/or size to be received by recesses 148 (see FIGS. 4 and 14) of the housing 112. That is, the recesses 148 may receive the engagement portions 146 of the latches 140 when the covers 110 are closed. However, the engagement portions 146 no longer occupy the recesses 148 when the covers 110 are opened. As such, the tip portions 170 may be received by the recesses 148 (see FIG. 14).

Figure 14:
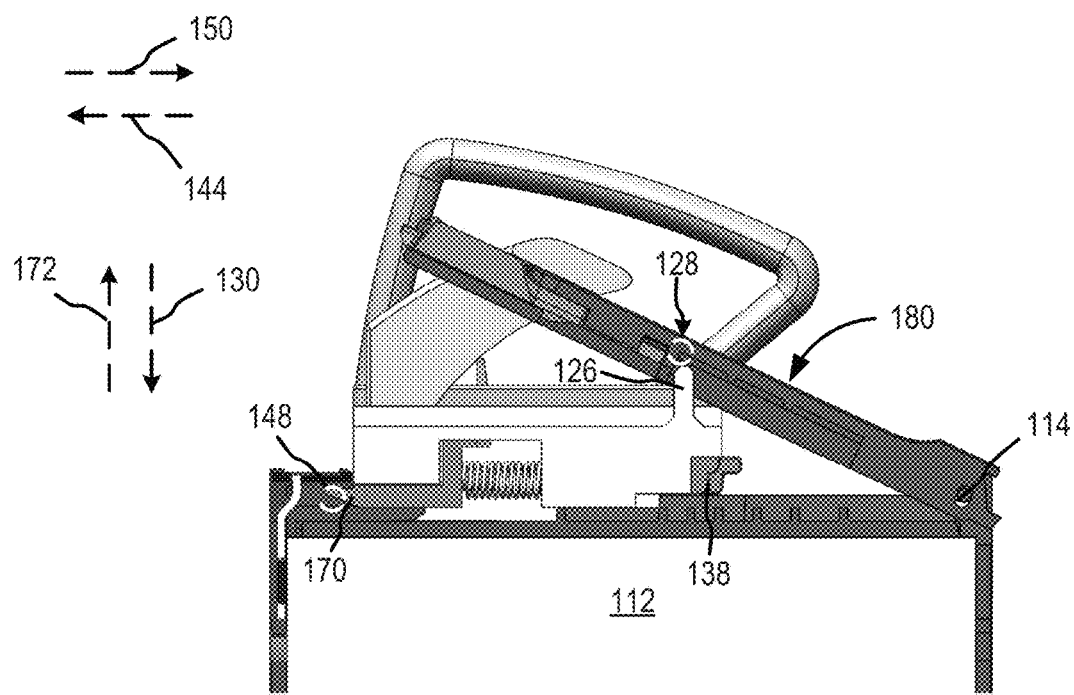

Referring to FIGS. 13 and 14, after a user unlocks the covers 110 using the driver ejector 138, a user can continue to move the storage media loader 102 in the second direction 150. Once the user slides the storage media loader 102 far enough in the second direction 150, the tip portions 170 will slide into the recesses 148. The spring 164 biases the moveable lock 160 in the first direction 144 and, as a result, the moveable lock 160 is secured into the recess 148.

When the tip portions 170 are received by the recesses 148, another engagement between the storage media loader 102 and the storage media carriers 106 is formed. The engagement between the tip portions 170 and the recesses 148 may be referred to herein as the second engagement between the storage media loader 102 and the storage media carrier 106.

Similar to the first engagement, the likelihood the storage media carrier 106 is dropped while carrying the storage media carrier 106 with the storage media loader 102 may be reduced by the second engagement because the second engagement restricts movement between the storage media loader 102 and the storage media carrier 106. That is, the second engagement prevents the storage media loader 102 from moving in the first direction 144 relative to the storage media carriers 106. In addition, the second engagement prevents the storage media loader 102 from moving in an upward direction 172 (see FIG. 9, 10, 12, 14-16) and/or downward direction 130 relative to one another. In embodiments, the upward direction 172 may be substantially from the bottom side 120 towards the top side 118.

The number of tip portions 170 may vary depending on how many storage media carriers 106 the storage media loader 102 is configured to carry. For example, a storage media loader 102 having six tip portions 170 may be configured to carry six storage media carriers 106.

In at least one embodiment, the tip-portion width 174 (see FIG. 8) may be the same or similar as the engagement projection width 132. Additionally or alternatively, the separation 176 (see FIG. 8) between the tip portions 170 may be the same or similar as the separation 134 between the engagement projections 126. In embodiments, the tip portion width 174 and/or the separation 176 may depend on the storage media carrier width 136. For example, if the storage media carrier width 136 is X, then the tip portion width 174 may be n*X and the separation 176 between the tip portions 170 may be (1-n)*X, where n is a number greater than 0 and less than 1.

Referring back to FIGS. 5-10, the storage media loader 102 may also include a stopper 178. The stopper 178 may be of a size and/or shape to engage top sides 180 (see FIGS. 4, 14, and 15) of the covers 110. To do so, the stopper 178 may be arranged on the top side 118 of the base 116 near the trailing edge 124. In one embodiment, the stopper 178 and the base 116 are a unitary structure. In another embodiment, the stopper 178 and the base 116 are fixedly coupled and/or fused together. In these embodiments, the stopper 178 and the base 116 may be coupled together using one or more fasteners (e.g., screws) and/or adhered to one another (e.g., using glue, epoxy).

Referring to FIG. 6, the stopper 178 may include supports 182 extending from the top side 118. A lateral support 184 may connect the supports 182. The lateral support 184 may be the portion of the stopper 178 that is configured to engage top sides 180 of the covers 110. The supports 182 may be separated by a distance 186 to fit a specific number of covers 110 therebetween. For example, the number of covers 110 to fit between the supports 182 may be the same as the number of engagement projections 126. As another example, the number of covers 110 to fit between the supports 182 may be the same as the number engagement ledges 152. As even another example, the number of covers 110 to fit between the supports 182 may be the same as the number of tip portions 170.

Figure 15:
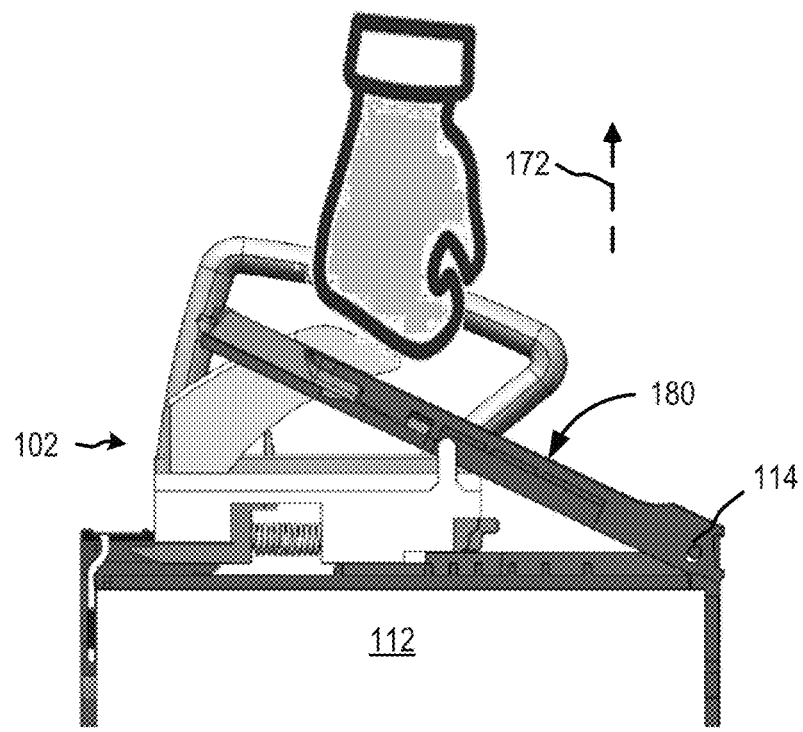

By engaging the top side 180, the stopper 178 prevents the covers 110 from opening any farther once coming into contact with the stopper 178 (see FIGS. 13-15). The engagement between the stopper 178 and the top sides 180 of the covers 110 may be referred to herein as a third engagement between the storage media loader 102 and the storage media carrier 106. Due to the third engagement, the likelihood the storage media carrier 106 is dropped while carrying the storage media carrier 106 with the storage media loader 102 may be reduced because the third engagement restricts movement between the storage media loader 102 and the storage media carrier 106. That is, the stopper 178 prevents the cover 110 from moving in an upward direction 172 once the top sides 180 of the covers 110 come into contact with the stoppers 178. As such, the stopper 178 may function as a lock, and more specifically an upper lock on the covers 110.

Figure 9:
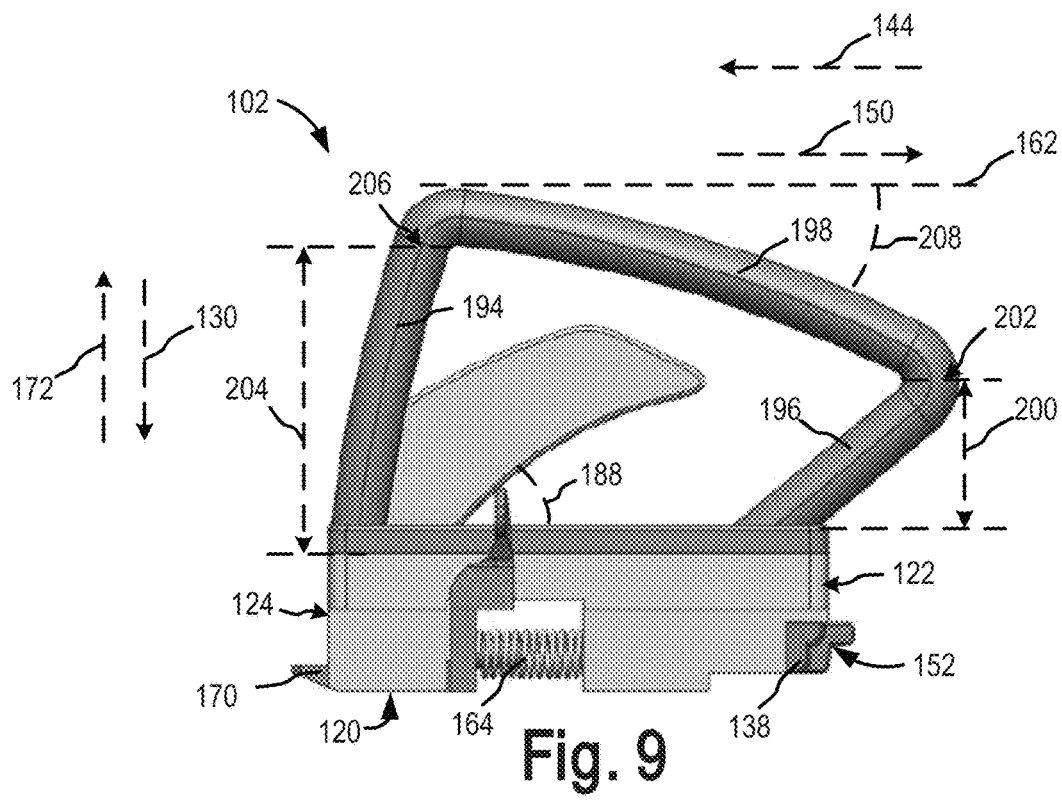
FIG. 9 is a side view of the storage media loader of FIG. 1.
Figure 10:
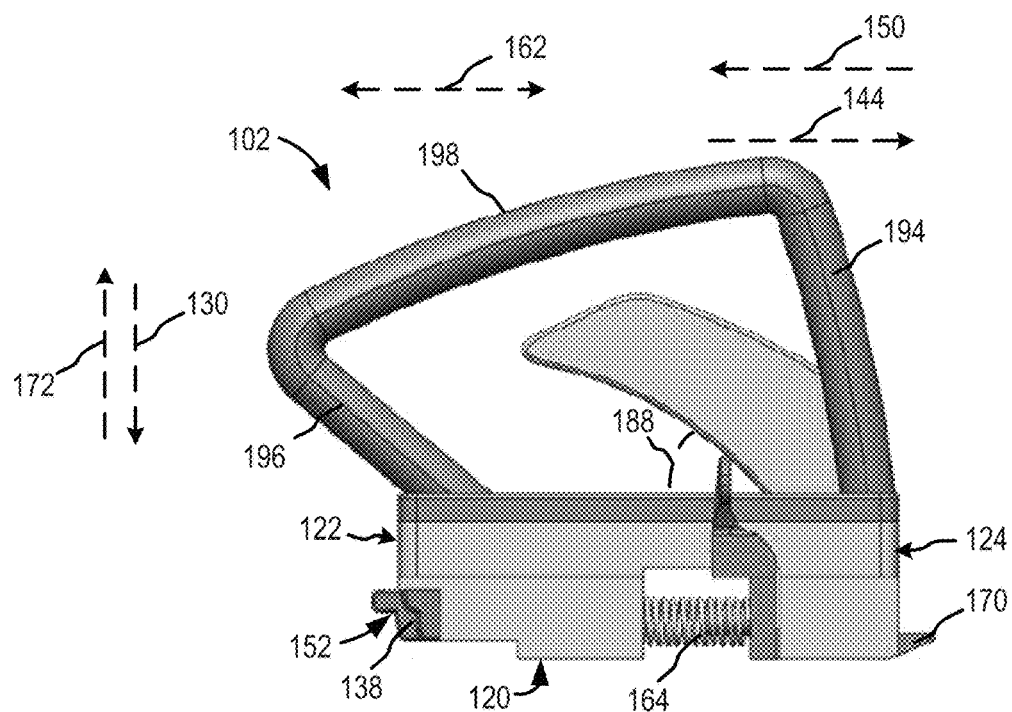
FIG. 10 is another side view of the storage media loader of FIG. 1.

The supports 182 may extend from a surface of the top side 118 at different angles 188 (see FIGS. 6, 9, and 10). For example, the angles 188 at which the supports 182 may extend from a surface of the top side 118 may be greater than 0 degrees and less than or equal to 90 degrees. The angles 188 may be configured so the direction of the third engagement works in concert with the first engagement. That is, in addition to preventing the covers 110 from opening any farther, the stopper 178 also facilitates maintaining the first engagement between the storage media loader 102 and the storage media carrier 106. For example, because the stopper 178 prevents the covers 110 from opening any farther once the stopper 178 engages the top side 180 of the covers 110, the engagement between the engagement projections 126 and the indentations 128 will be maintained once a user lifts the storage media carriers 106 from the storage media system 104.

The storage media loader 102 may also include handles 190. The handles 190 may be arranged on the top side 118 of the base 116. In one embodiment, the handles 190 and the base 116 are a unitary structure. In another embodiment, the handles 190 and the base 116 are fixedly coupled and/or fused together. In these embodiments, the handles 190 and the base 116 may be coupled together using one or more fasteners 192 (e.g., screws) and/or adhered to one another (e.g., using glue, epoxy).

The handles 190 may be ergonomically shaped to reduce the likelihood of repetitive stress injury of a user that uses the storage media loader 102. For example, referring to FIGS. 9-10, the handles 190 may include a leading support 194, a trailing support 196, and a connecting part 198 that connects the leading support 194 and the trailing support 196. A first distance 200 between a surface of the top side 118 and a distal end 202 of the leading support 194 may be less than a second distance 204 between a surface of the top side 118 and a distal end 206 of the trailing support 194. As such, an angle 208 between the connecting part 198 and the plane 162 is greater than 0 degrees. Therefore, when a user uses the grasps the handles 190 and pulls the storage media loader 102 towards himself/herself, so the drive ejector 138 engages the latches 140 (see FIGS. 11 and 12), the user's wrists will be straight or only have a slight bend, thereby reducing the likelihood the user strains their wrists while using the storage media loader 102.

Figure 16:
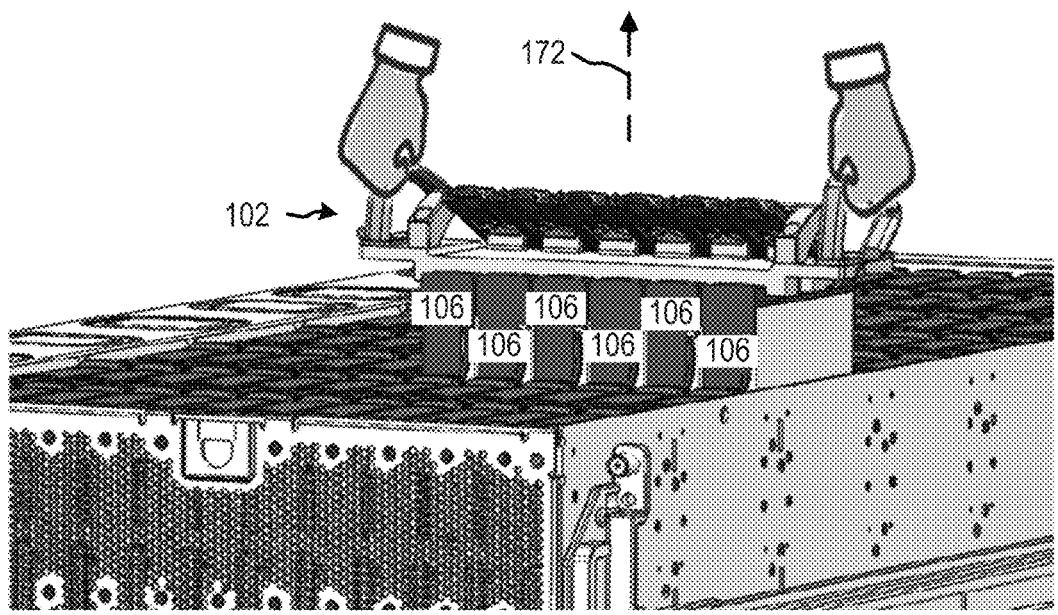

Once the storage media loader 102 engages the storage media carriers 106 at the first, second, and third engagements, a user may grasp the handles 190 to lift and remove the storage media carriers 106 from the storage media system 104, as shown in FIGS. 15-16. That is, a user may provide a force on the storage media carriers 106 in an upward direction 172 to remove the storage media carriers 106 from the storage media system.

Figure 17:
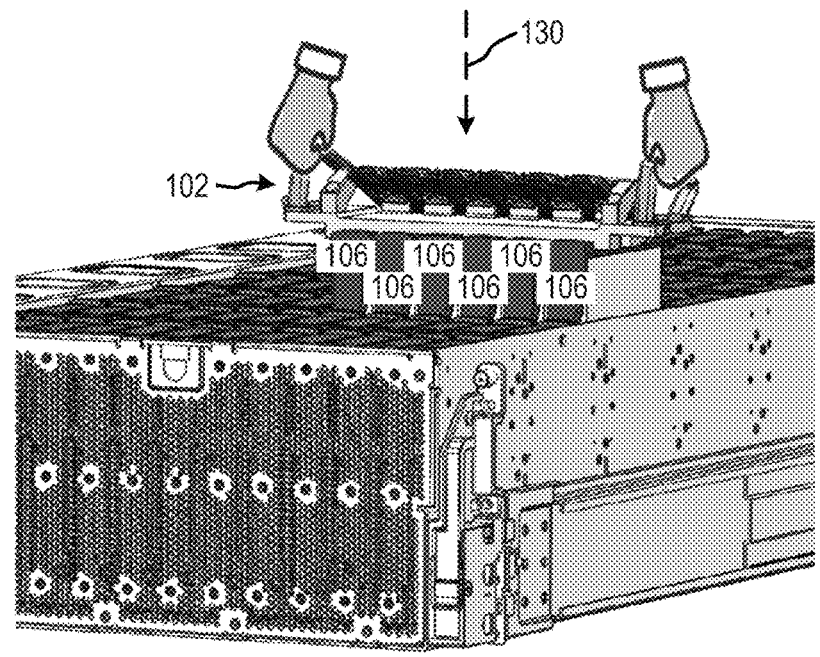
FIGS. 17-19 are schematic representations of installing storage media carrier using the storage media loader of FIG. 1, in accordance with certain embodiments of the present disclosure.
Figure 18:
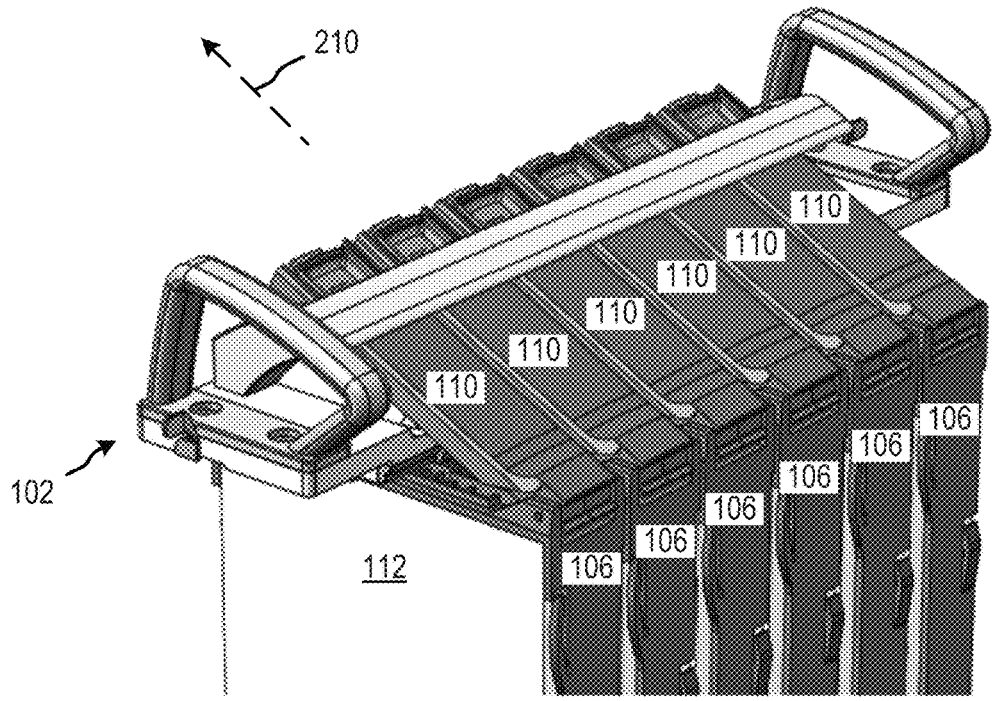
Figure 19:
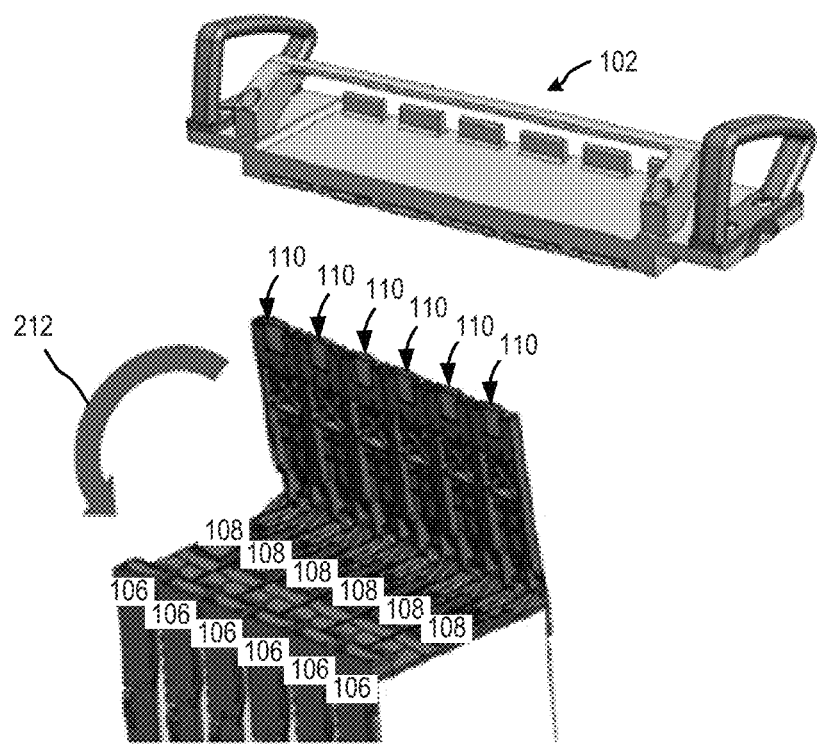

Conversely, when inserting the storage media carriers 106 into the storage media system 104, a user may provide a force on the storage media carriers 106 in a downward direction 130, as shown in FIG. 17. Once the storage media carriers 106 are arranged within the storage media system 104, a user may remove the storage media loader 102 by moving the storage media loader 102 in the second direction 150 so the tip portions 170 are no longer in the recesses 148 and then remove the storage media loader 102 by moving it in a diagonal direction 210, as shown in FIG. 18. Once the storage media loader 102 is removed, the covers 110 may be closed by moving the covers in the direction 212 indicated in FIG. 19.

As a result of the first, second and third engagements between the storage media loader 102 and the storage media carriers 106, not all the weight of the storage media carriers 106 is placed on the pins 114. For example, some of the weight is distributed to the recess 148 due to the second engagement. As such, even if a pin 114 breaks, the storage media loader 102 may retain the storage media carrier 106. Furthermore, force on the pins 114 will substantially be in an upward direction 172 when the user is removing the storage media carriers 106 from the storage media system 104. As such, torque on the pins 114 may be reduced in comparison to when the storage media carriers 106 are carried in a conventional manner.

Figure 20:
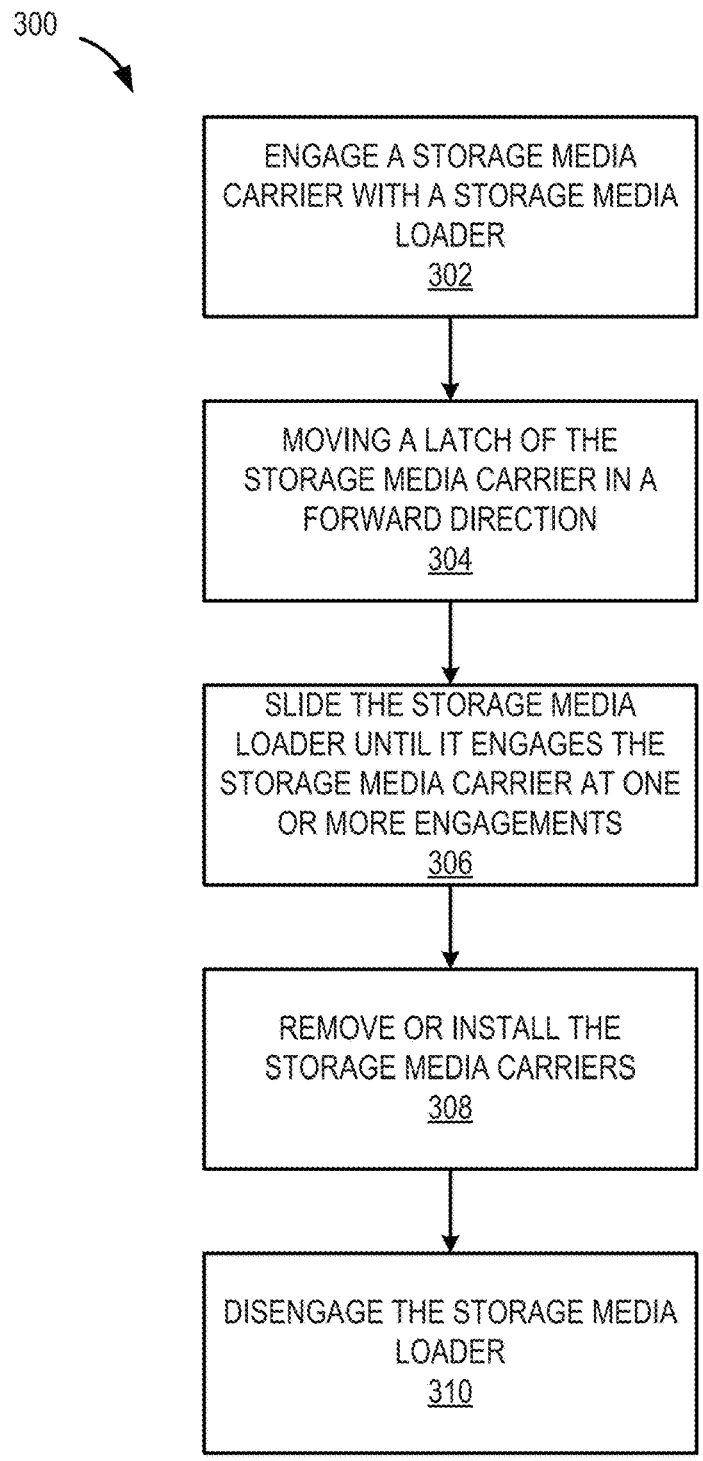
FIG. 20 is a flow diagram of a method of using a storage media loader, in accordance with certain embodiments of the present disclosure.

FIG. 20 is a flow diagram of a method 300 of using the storage media loader, in accordance with certain embodiments of the present disclosure. The method 300 comprises engaging a storage media carrier with a storage media loader (block 302). The storage media carrier may have the same or similar features as the storage media carrier 106 described above. Moreover, the storage media loader may have the same or similar features as the storage media loader 102 described above. For example, a drive ejector of the storage media loader may engage a latch of the storage media carrier.

The method 300 further comprises moving a latch of the storage media carrier in a forward direction (block 304). In embodiments, the forward direction may be the same or similar as the forward direction 150 described above, also referred to as the second direction 150. The method 300 further comprises sliding the storage media loader in the forward direction until the storage media loader engages the storage media carrier at one or more engagements (block 306). In embodiments, the one or more engagements may be the same or similar to the engagements described above. For example, the one or more engagements may include the first engagement, the second engagement, and/or the third engagement.

The method 300 further comprises removing the storage media carrier from a storage media system and/or installing the storage media carrier in the storage media system (block 308). In embodiments, the storage media loader may be removed from and/or installed in the storage media system in a manner that is the same or similar to the manner described above. For example, the storage media carrier may be removed from the storage media system by lifting the storage media loader along with the storage media carriers in an upward direction. The upward direction may be the same or similar as the upward direction 172 described above. Additionally or alternatively, the storage media system may be installed in the storage media system by pushing the storage media system in a downward direction. The downward direction may be the same or similar as the downward direction 130 described above.

The method 300 may further comprise disengaging the storage media loader from the storage media carriers (block 310). In embodiments, the storage media loader may be disengaged from the storage media carriers in a manner that is the same or similar to the manner described above. For example, the storage media loader may be moved in a second direction and then in a diagonal direction that is the same or similar to the diagonal direction 210.

Various modifications and additions can be made to the embodiments disclosed without departing from the scope of this disclosure. For example, while the embodiments described above refer to particular features, the scope of this disclosure also includes embodiments having different combinations of features and embodiments that do not include all of the described features. Accordingly, the scope of the present disclosure is intended to include all such alternatives, modifications, and variations as falling within the scope of the claims, together with all equivalents thereof.

We claim:

1. A loader assembly comprising:
a base having a top side, a bottom side, a leading edge, and a trailing edge;
a moveable lock configured to move with respect to the base, the moveable lock including a tip portion configured to engage a storage media carrier;
a lower stationary lock separate from the moveable lock and extending from the top side of the base near the leading edge; and
an upper stationary lock separate from the moveable lock and extending from the top side near the trailing edge.

2. The loader assembly of claim 1, the lower stationary lock being integrally formed with the base.

3. The loader assembly of claim 1, the lower stationary lock including spaced-apart projections, wherein each spaced-apart projection is configured to engage a bottom side of a cover of the storage media carrier.

4. The loader assembly of claim 1, the lower stationary lock extending substantially perpendicular from a surface of the top side of the base.

5. The loader assembly of claim 1, further comprising at least one handle extending from the top side of the base.

6. The loader assembly of claim 1, the upper stationary lock including a surface shaped to engage a top surface of the cover of the storage media carrier.

7. The loader assembly of claim 1, the moveable lock configured to move linearly along a plane extending between the leading edge to the trailing edge.

8. The loader assembly of claim 1, the moveable lock coupled to the base via a means biasing the moveable lock in a direction towards the leading edge.

9. The loader assembly of claim 1, the tip portion including multiple spaced apart tip portions.

10. The loader assembly of claim 1, further comprising a drive ejector arranged near the bottom side of the base near the leading edge.

11. A method comprising:
engaging a storage media carrier with a storage media loader;
moving a latch of the storage media carrier in a forward direction using the storage media loader to open a cover of the storage media loader;
sliding the storage media loader in the forward direction until the storage media loader engages the storage media carrier at one or more engagements, including engaging the cover of the storage media loader with the one or more engagements; and
removing the storage media carrier from a storage media system or installing the storage media carrier in the storage media system.

12. The method of claim 11, wherein engaging the storage media carrier with a storage media loader comprises engaging the latch of the storage media carrier with a drive ejector of the storage media loader.

13. The method of claim 11, wherein the one or more engagements comprise a first engagement, a second engagement, and a third engagement.

14. The method of claim 11, further comprising disengaging the storage media loader from the storage media carrier.

15. A storage media loader comprising:
a base having a top side, a bottom side, a leading edge, and a trailing edge;
a spring-loaded moveable lock including a body portion and a tip portion both positioned along the bottom side of the base, the moveable lock configured to engage a portion of a storage media carrier;
a spring positioned between the body portion of the moveable lock and the base;
at least one projection separate from the moveable lock and extending from the top side of the base near the leading edge, each projection of the at least one projection configured to engage a bottom side of a cover of the storage media carrier; and
a stopper separate from the moveable lock and coupled to the top side near the trailing edge, the stopper configured to engage a top side of the cover of the storage media carrier.

16. The storage media loader of claim 15, the at least one projection being integrally formed with the base.

17. The storage media loader of claim 15, the at least one projection extending substantially perpendicular from a surface of the top side of the base.

18. The storage media loader of claim 15, the moveable lock configured to move along a plane extending between the leading edge to the trailing edge.

19. The storage media loader of claim 15, further comprising at least one handle extending from the top side of the base.

20. The storage media loader of claim 19, the at least one handle comprising a leading support, a trailing support, and a connecting part extending between the leading support and the trailing support, where a distance between a surface of the top side and a distal end of the leading support is less than a distance between the surface of the top side and a distal end of the trailing support.

* * * * *